United States Patent [19]

Smith et al.

[11] Patent Number: 4,479,846
[45] Date of Patent: Oct. 30, 1984

[54] METHOD OF ENTRAINING DISLOCATIONS AND OTHER CRYSTALLINE DEFECTS IN HEATED FILM CONTACTING PATTERNED REGION

[75] Inventors: Henry I. Smith, Sudbury; Michael W. Geis, Acton, both of Mass.

[73] Assignee: Massachusetts Institute of Technology, Cambridge, Mass.

[21] Appl. No.: 391,130

[22] Filed: Jun. 23, 1982

[51] Int. Cl.³ .............................................. C30B 13/06
[52] U.S. Cl. .................... 156/603; 156/612; 156/DIG. 73; 156/DIG. 88; 148/176
[58] Field of Search ............... 156/603, 612, DIG. 64, 156/DIG. 73, DIG. 88, DIG. 105; 148/174, 176; 427/85–87

[56] References Cited

U.S. PATENT DOCUMENTS

| 4,071,383 | 1/1978 | Nagata et al. | 156/612 |
| 4,168,998 | 9/1979 | Hasegawa et al. | 156/612 |
| 4,211,821 | 7/1980 | Hadni | 156/612 |
| 4,330,363 | 5/1982 | Biegesen et al. | 156/DIG. 88 |
| 4,332,879 | 6/1982 | Pastor et al. | 427/87 |
| 4,333,792 | 6/1982 | Smith | 156/DIG. 88 |

FOREIGN PATENT DOCUMENTS

| 8102948 | 10/1981 | Int'l Pat. Ins. (IIB) | 156/612 |
| 39571 | 3/1979 | Japan | 156/DIG. 88 |

OTHER PUBLICATIONS

J. P. Colinge et al., Use of Selective Annealing for Growing Very Large Grain Silicon on Insulator Films, Appl. Phys. Lett. 41 (4), Aug. 15, 1982, pp. 346, 347.
J. P. Colinge et al., Selective Annealing of Silicon on Insulator Films, Abstract No. 147, CNET-BP 42, F-38240 Meylan, France, pp. 238, 239.
M. W. Geis et al., Zone-Melting Recrystallization of Encapsulated Silicon Films on $SiO_2$-Morphology and Crystallography, Appl. Phys. Lett. 40 (2), Jan. 15, 1982, pp. 158–160.
M. Geiss et al., Crystallographic Orientation of Silicon on an Amorphous Substrate using an Artifical Surface-Relief Grating and Laser Crystallization, Appl. Phys. Lett. 35 (1), Jul. 1, 1979, pp. 71–74.

Primary Examiner—David Lacey
Attorney, Agent, or Firm—Arthur A. Smith, Jr.; Charles Hieken

[57] ABSTRACT

A process for entraining dislocations and other crystalline defects in a thin film includes coating a substrate, such as a layer of thermally grown silicon dioxide on a silicon wafer with the thin film of polycrystalline or amorphous silicon in the thickness range 0.05–10$\mu$ deposited by chemical vapor deposition. An encapsulation layer that is a composite of 2 $\mu$m thickness $SiO_2$, 30 nm of $Si_3N_4$ is deposited on the thin film. A pattern of stripes is created on this encapsulation layer made of materials, such as titanium, silicon, silicon dioxide and photoresist. A long and narrow molten zone is created in the film with its long axis oriented perpendicular to the lines and is moved with a movable strip-heater over in a direction parallel to the lines in the recrystallization process to establish the dislocation and other crystalline defects in the film entrained to follow the pattern of stripes at locations related to the stripes.

13 Claims, 5 Drawing Figures

FIG. 1
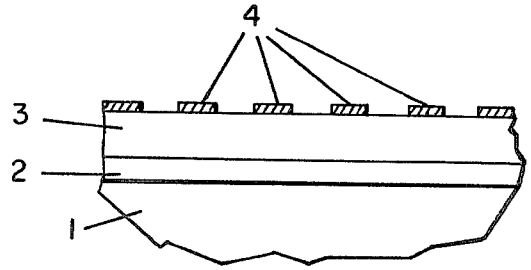
FIG. 2
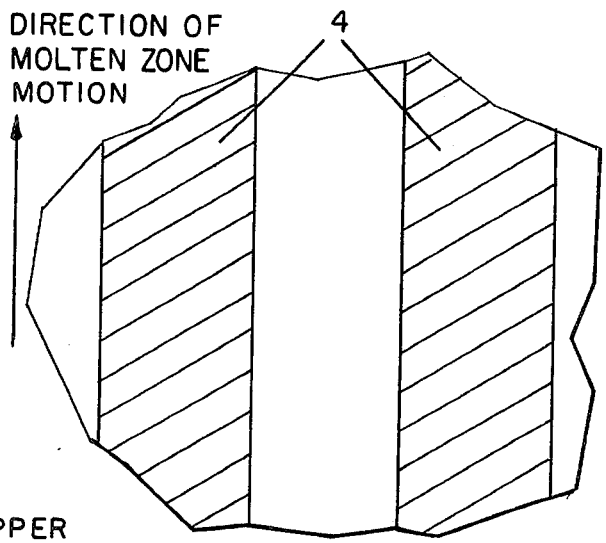
DIRECTION OF MOLTEN ZONE MOTION
FIG. 3
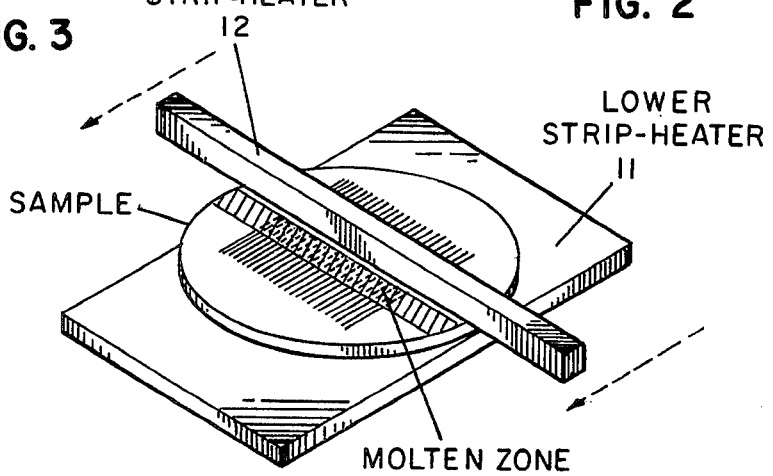
MOVABLE UPPER STRIP-HEATER 12
LOWER STRIP-HEATER 11
SAMPLE
MOLTEN ZONE
FIG. 4
FIG. 4B
ENTRAINED SUBBOUNDARIES
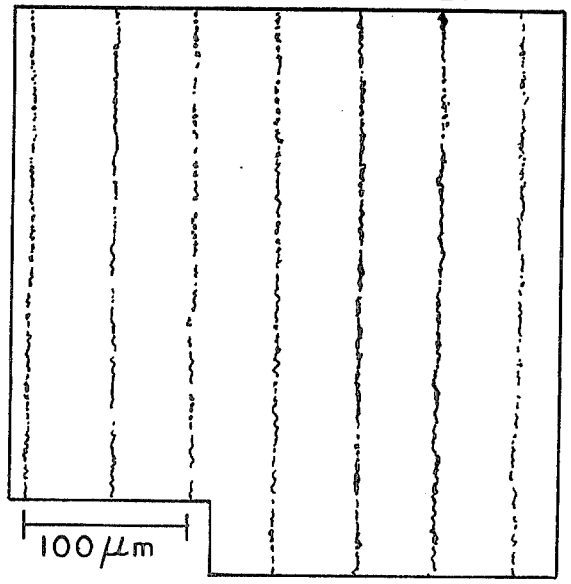
100 μm
FIG. 4A
PRIOR ART SUBBOUNDARY PATTERN
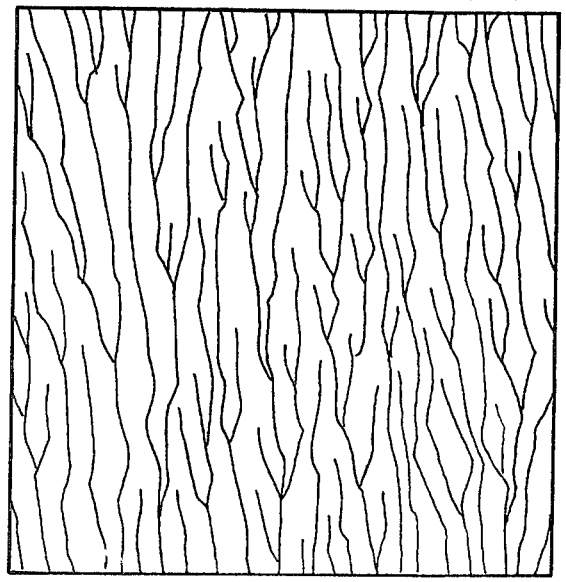

METHOD OF ENTRAINING DISLOCATIONS AND OTHER CRYSTALLINE DEFECTS IN HEATED FILM CONTACTING PATTERNED REGION

The Government has rights in this invention pursuant to Contract Number N00014-79-C-0908 awarded by the U.S. Navy.

This invention relates in general to improving the quality of thin crystalline films by confining, or entraining, crystalline boundaries to predetermined locations.

Thin films of crystalline material are important in many fields of science and technology. In semiconductor electronics there is considerable interest in obtaining high-quality semiconductor films on insulating substrates, especially silicon (Si) on silicon dioxide ($SiO_2$). In recent years numerous investigators have produced large-grain polycrystalline films of Si on $SiO_2$ by melting fine-grain polycrystalline Si using a laser or strip-heater and then allowing the melt to resolidify. Such processes are generally referred to as laser recrystallization, strip-heater recrystallization or zone-melting recrystallization. In some cases, the molten material is given direct access to a single-crystal silicon substrate through an opening in the $SiO_2$. The single crystal Si substrate then serves as a seed, enabling the Si film which grows laterally across the $SiO_2$ to have the same crystallographic orientation as the seed. However, low-angle grain boundaries or subboundaries generally appear in the "single orientation" recrystallized Si films. Subboundaries are also present within grains of films produced without substrate seeding. Both large-angle and low-angle grain boundaries are undesirable for microelectronic devices, especially highly integrated circuits. (Henceforth both types of boundaries will be called simply "boundaries" or "crystalline boundaries".) The elimination or confinement of all such boundaries is highly desirable. It is therefore an object of this invention to provide a technique which, when used in conjunction with recrystallization of thin films, confines boundaries to predetermined positions.

It is a further object of this invention to provide a technique which will induce undesirable impurities to concentrate at these same positions.

It is a further object of this invention to achieve one or more of the preceding objects using patterns produced by planar fabrication processes to define the predetermined positions.

According to the invention, a film to be processed is located on top of a substrate and, in some cases, is covered with an encapsulation layer. A pattern, generally having the form of uniformly-spaced parallel features, is intentionally created in or on the substrate, or in or on the encapsulation layer or in the film. The film is processed by passing a molten zone through it in such a way that dislocations and other crystalline defects which occur in the film are entrained to follow the pattern. In this way these dislocations and other crystalline defects are located at predetermined positions.

Numerous other features, objects and advantages of the invention will become apparent from the following specification when read in connection with the accompanying drawing in which:

FIG. 1 is a cross-sectional view of a sample with a pattern for producing entrainment of crystalline boundaries;

FIG. 2 is an enlarged top view of a portion of the sample of FIG. 1 illustrating the parallel relationship between the axis of the entrainment pattern and the direction of motion of the molten zone;

FIG. 3 is a perspective view of a movable strip-heater oven used for zone-melting recrystallization; and FIG. 4, A and B are micrographs illustrating recrystallization by the zone-melting process without and with an entrainment pattern, respectively.

With reference now to the drawings, there is shown in FIG. 1 a cross-sectional view of a sample on which there has been created a pattern designed to produce entrainment of crystalline boundaries, as well as the localization of various other defects and impurities. The substrate 1 is coated with a film 2 to be recrystallized. A suitable substrate is a film of thermally grown $SiO_2$ on a Si wafer. On top of this substrate a thin film 2 to be recrystallized and entrained is deposited. Experimental work has been mostly with films of polycrystalline or amorphous silicon in the thickness range 0.05–10 $\mu$m, deposited by chemical vapor deposition (CVD) means. On top of this film is an encapsulation layer 3. In experimental work this encapsulation layer has mostly been a composite of 2 $\mu$m thickness $SiO_2$, 30 nm of $Si_3N_4$. On top of the encapsulation layer, a pattern of stripes 4 is created, as shown in cross section in FIG. 1 and in a magnified top view in FIG. 2. This pattern of stripes is known as the entrainment pattern and has been made of a variety of materials, including titanium, a material that reflects radiation, silicon, silicon dioxide, and photoresist, a material that absorbs radiation. The latter was heated to a high temperature to cause carbonization. FIG. 2 illustrates that the axis of the entrainment pattern is aligned parallel to the direction of motion of the molten zone, indicated by the arrow in FIG. 2. The composition, cross-sectional profile, thickness, linewidth and spacing (i.e., spatial period) of the entrainment pattern are subject to control and can be varied over a wide range. A typical spatial period is 100 $\mu$m. A pattern more complex than a simple linear grating for example, a pattern whose spatial period varies periodically, is also included within the scope of this invention.

Once the sample has been prepared, as indicated in FIGS. 1 and 2 the recrystallization process is carried out by creating a molten zone in the film 2 and moving this molten zone in a direction parallel to the axis of the entrainment pattern. Typically, the molten zone is long and narrow, with its long axis oriented perpendicular to the lines of the entrainment pattern. FIG. 3 shows two heaters, a lower fixed strip-heater 11 and an upper movable strip-heater 12.

When the zone-melting recrystallization is done without the entrainment pattern for polycrystalline silicon films over $SiO_2$, encapsulated with 2 $\mu$m $SiO_2$/30 mm $Si_3N_4$, a film is obtained which consists of large crystalline grains approximately 1 mm wide by several mm long, depending upon the distance over which the molten zone is scanned (see, for example, M. W. Geis, H. I. Smith, B-Y. Tsaur, John C. C. Fan, E. W. Maby and D. A. Antoniadis, entitled "Zone-melting recrystallization of encapsulated silicon films on $SiO_2$—morphology and crystallography", Applied Physics Letters, Vol. 40, p. 158–160, 1982). Within individual grains there are subboundaries which include arrays of dislocations and other types of defects. The subboundaries form a characteristic pattern but otherwise have random locations, as described in several published articles, including the above cited article in Applied Physics Letters. The major grain boundaries also have random lateral locations. Within these films there is a strong preference for (100) texture to dominate. That is, the (100) planes of grains are predominantly parallel to the substrate plane. In addition, as the molten zone is moved along the length of a Si film, there is a tendency for the crystalline Si which freezes at the trailing edge of the molten zone to be dominated by grains having <100> directions within several degrees of the scan direction.

When an entrainment pattern is used in conjunction with the zone melting recrystallization process, described above, a dramatic change in the pattern of crystalline boundaries can be effected: these boundaries can be made to align parallel to, and with the same spacing as, the entrainment pattern. This entrainment is illustrated graphically in FIGS. 4A and 4B which show a comparison of a film which had been recrystallized by the zone-melting process without an entrainment pattern (FIG. 4A) and the result obtained with an entrainment pattern (FIG. 4B). This result represents a novel use of an artificial planar pattern to control the defect structure of a crystalline thin film in a predetermined way.

In addition to controlling the location of crystalline boundaries, impurities also tend to concentrate at the entrained boundaries.

It is believed that in zone-melting recrystallization of encapsulated Si the interface between liquid and solid is faceted, and the subboundaries form at the interior corners of this faceted interface as it moves along. Impurities rejected into the liquid during solidification would likewise tend to concentrate at the interior corners. Thus, it appears that to entrain boundaries one needs to control the locations of the interior corners. In the entrainment method described above, with a pattern of carbonized stripes on top of the encapsulation layer, the boundaries, and hence the interior corners, are entrained to lie under the carbonized stripes. It is believed that the mechanism is thermal; that is, the entrainment pattern modulates the lateral temperature profile in the film in a controlled, periodic manner, and the interior corners become locked in or "entrained" with this pattern-induced temperature profile.

The entrainment of the interior corners of a solidification front need not depend on temperature modulation alone. For example, it has been discovered that under certain circumstances relief structures in a substrate can entrain crystalline boundaries in a film recrystallized over that substrate. It is believed that in this case the relief structure causes a local indentation or perturbation in the solidification front. There are numerous versions of artificially created patterns that could be employed to entrain boundaries. The principle of this invention, however, is common to all: produce a pattern which alters the contour of the solidification front such that the sources of the crystalline boundaries lock in step with the artificial pattern. Another approach would be to create the pattern in the film itself.

Another approach to entraining crystalline boundaries is to use a pattern of stripes of a material whose interfacial tension with the solidifying material causes a modulation of the position of the solidification front. This pattern could be put on the substrate or in or on the encapsulation layer 3.

The technique of using an artificial pattern to entrain crystalline boundaries during the recrystallization of a thin film is applicable to materials other than silicon. Other important semiconductors, such as GaAs, InP, InSb, GaAlAs, could probably also be recrystallized and entrained in a similar manner. In fact, during the 1960's several workers demonstrated the recrystallization of InSb by a process similar to that described above for Si. They did not, however, describe or anticipate the entrainment of crystalline boundaries through the use of planar patterns.

There has been described novel apparatus and techniques for entraining crystalline boundaries to produce novel articles of manufacture. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. A method of entraining dislocations and other crystalline defects in a film on a substrate which method includes the steps of intentionally creating a predetermined pattern in a region embracing at least one of said film and said substrate to form a patterned region,
    and processing said film by passing a heated zone through said film in a predetermined direction to establish dislocations and other crystalline defects in said film entrained to follow said pattern and located at predetermined positions related to said pattern.

2. A method in accordance with claim 1 wherein the step of creating said predetermined pattern comprises forming parallel lines.

3. A method in accordance with claim 1 and further including the step of covering said film with an encapsulation layer and forming parallel lines in said encapsulation layer to form said patterned region.

4. A method in accordance with claims 2 or 3 and further including the step of uniformly spacing said parallel lines.

5. A method in accordance with claim 3 and further including the step of forming said parallel lines substantially parallel to said predetermined direction.

6. A method in accordance with claim 1 and further including the step of establishing said pattern with material that reflects radiation.

7. A method in accordance with claim 1 and further including the step of establishing said pattern with material that absorbs radiation.

8. A method in accordance with claim 1 and further including the step of forming said pattern by establishing a relief structure.

9. A method in accordance with claim 8 and further including the step of forming said relief structure in said substrate.

10. A method in accordance with claim 8 and further including the step of covering said thin film with an encapsulating layer and forming said relief structure in said encapsulating layer.

11. A method in accordance with claim 1 and further including the step of forming said pattern with material of a chemical composition that differs from that of the material of the surface in which the pattern is created.

12. A method in accordance with claim 1 wherein said processing said film while in contact with said patterned region includes the step of spatially modulating the temperature in said film with said pattern.

13. A method in accordance with claim 1 wherein said processing said film while in contact with said patterned region includes creating a spatially varying concentration of impurity atoms in said film with said pattern.

* * * * *